United States Patent
Chen et al.

[11] Patent Number: 6,133,105
[45] Date of Patent: Oct. 17, 2000

[54] METHOD OF MANUFACTURING BORDERLESS CONTACT HOLE INCLUDING A SILICIDE LAYER ON SOURCE/DRAIN AND SIDEWALL OF TRENCH ISOLATION STRUCTURE

[75] Inventors: Wen-Ji Chen, Chang-Hua Hsien; Shih-Ying Hsu, Hsinchu, both of Taiwan

[73] Assignee: United Microelectronics Corp., Hsinchu, Taiwan

[21] Appl. No.: 09/300,553

[22] Filed: Apr. 27, 1999

[51] Int. Cl.⁷ .......................... H01L 21/336; H01L 21/76; H01L 21/3205; H01L 21/44

[52] U.S. Cl. .......................... 438/296; 438/424; 438/435; 438/437; 438/586; 438/585; 438/655

[58] Field of Search ..................................... 438/296, 424, 438/435, 437, 586, 585, 655

[56] References Cited

U.S. PATENT DOCUMENTS

| | | |
|---|---|---|
| 4,983,544 | 1/1991 | Lu et al. . |
| 5,741,740 | 4/1998 | Jang et al. . |
| 5,780,348 | 7/1998 | Lin et al. . |
| 5,792,684 | 9/1998 | Lee et al. . |
| 5,904,531 | 5/1999 | Liaw . |
| 5,972,774 | 10/1999 | Matumoto . |
| 5,976,951 | 11/1999 | Huang et al. . |
| 5,994,200 | 11/1999 | Kim . |
| 6,017,801 | 1/2000 | Youn . |
| 6,037,018 | 3/2000 | Jang et al. . |
| 6,037,238 | 3/2000 | Chang et al. . |

*Primary Examiner*—Jey Tsai
*Assistant Examiner*—Ron Pompey
*Attorney, Agent, or Firm*—Hickman Coleman & Hughes, LLP

[57] ABSTRACT

A method of manufacturing a borderless contact hole. A substrate having a pad oxide layer and a silicon nitride layer formed thereon is provided. A trench is formed to penetrate through the silicon nitride layer and the pad oxide layer and into the substrate. A first oxide layer is formed in the trench, wherein a surface level of the first oxide layer is lower than that of the substrate. An etching stop layer is formed on the silicon nitride layer, a sidewall of the trench and the first oxide layer, conformally. A second oxide layer is formed on the etching stop layer and fills the trench. A portion of the second oxide layer, a portion of the etching stop layer, the silicon nitride layer and the pad oxide layer are removed. A portion of the second oxide layer in the trench and a portion of the etching stop layer in the trench are removed to form a recess until the surface level constructed by the remaining second oxide layer and the remaining etching stop layer is lower than a surface level of the substrate. A source/drain region is formed in the substrate adjacent to the trench. A silicide layer is formed on a surface of the source/drain region and a sidewall of the recess. A dielectric layer is formed over the substrate. A contact hole is formed to penetrate through the dielectric layer and exposes a portion of the silicide layer.

16 Claims, 3 Drawing Sheets

METHOD OF MANUFACTURING BORDERLESS CONTACT HOLE INCLUDING A SILICIDE LAYER ON SOURCE/DRAIN AND SIDEWALL OF TRENCH ISOLATION STRUCTURE

BACKGROUND OF THE INVENTION

1. Field of the Invention

The present invention relates to a method of manufacturing a borderless contact hole. More particularly, the present invention relates to a method of manufacturing a borderless contact hole having low resistance.

2. Description of the Related Art

With the decrease of wire width in ICs and the increase of integration of ICs, the size of a contact in a device becomes small. Hence, it is more difficult to align a contact hole site with the contact of the device. When misalignment occurs as the dielectric layer is patterned to form a contact hole, the etching step used to form the contact hole may damage the isolation structure between devices. Therefore, the leakage happens.

In order to overcome the problem mentioned above, the method for manufacturing a borderless contact hole has been developed. Typically, method for manufacturing the borderless contact hole comprises the steps of forming an etching stop layer over a substrate and devices. An inter-layer dielectric (ILD) layer is formed on the etching stop layer. The ILD layer is patterned to expose a portion of the etching stop layer. The exposing etching stop layer is removed to form a contact hole. When misalignment happens, the etching stop layer can resist the continuation of the etching step, so that the isolation structure or the spacer adjacent to the contact of the device can be prevented by the etching stop layer. Therefore, the quality of the device can be maintained. As the wire width in ICs gradually decrease to 0.25 micrometers, or even below 0.25 micrometers, borderless contact hole structure is used instead of the conventional contact hole.

FIGS. 1A through 1C are schematic, cross-sectional views of a process for manufacturing a borderless contact hole.

As shown in FIG. 1A, a pad oxide layer 102 is formed on a substrate 100. A silicon nitride layer 104 is formed on the pad oxide layer 102. A trench 106 is formed to penetrate through the silicon nitride layer 104 and the pad oxide layer 102 and into the substrate 100. An oxide layer 108 is formed to fill the trench 106. A planarizing step is performed to remove a portion of the oxide layer 108 and silicon nitride layer 104 and to form a shallow trench isolation (STI) 110.

As shown in FIG. 1B, the silicon nitride layer 104 and the pad oxide layer 102 are removed. Since the material of the STI 110 is similar to that of the pad oxide layer, the surface level of the STI is almost equal to that of the substrate 100 after the pad oxide layer 102 is removed. A transistor 130 having a gate oxide layer 112, a gate electrode 114, a spacer 116 and a source/drain region 118 is formed on the substrate 100 adjacent to the STI 110.

As shown in FIG. 1C, a salicide process is performed to form a silicide layer 120 on the gate electrode 114 and the surface of the source/drain region 118. An etching stop layer 122 is formed over the substrate 100. A dielectric layer 124 is formed on the etching stop layer 122. When misalignment happens during contact hole 126 formation, contact hole 126 penetrates through the dielectric layer 124 and exposes a portion of the etching stop layer 122. The portion of the etching stop layer 122 exposed by the contact hole 126 is removed to expose a portion of the silicide layer 120 and the STI 110. Hence, the process for manufacturing the borderless contact hole is finished.

In the process for forming the borderless contact hole, although the isolation structure will not be damaged by the etching step when misalignment happens, the portion of the contact area exposed by the contact hole is greatly decreased. After a metal plug or a bit line is formed in the contact hole, the contact area is very small, so that the resistance between the metal plug or the bit line and the device increases. Therefore, the operation efficiency of the device is poor.

SUMMARY OF THE INVENTION

The invention provides a method of manufacturing a borderless contact hole. By using the invention, the resistance between the contact of the source/drain and the metal plug or bit line in the IC greatly decreases. Additionally, the layout can be saved. Moreover, the procedure of the invention is simpler than that of the conventional process.

To achieve these and other advantages and in accordance with the purpose of the invention, as embodied and broadly described herein, the invention provides a method of manufacturing a borderless contact hole. A substrate having a pad oxide layer and a silicon nitride layer formed thereon is provided. A trench is formed to penetrate through the silicon nitride layer and the pad oxide layer and into the substrate. A first oxide layer is formed in the trench, wherein a surface level of the first oxide layer is lower than that of the substrate. An etching stop layer is formed on the silicon nitride layer, a sidewall of the trench and the first oxide layer, conformally. A second oxide layer is formed on the etching stop layer and fills the trench. A portion of the second oxide layer, a portion of the etching stop layer, the silicon nitride layer and the pad oxide layer are removed. A portion of the second oxide layer in the trench and a portion of the etching stop layer in the trench are removed to form a recess until the surface level constructed by the remaining second oxide layer and the remaining etching stop layer is lower than a surface level of the substrate. A source/drain region is formed in the substrate adjacent to the trench. A silicide layer is formed on a surface of the source/drain region and a sidewall of the recess. A dielectric layer is formed over the substrate. A contact hole is formed to penetrate through the dielectric layer and expose a portion of the silicide layer. Since a portion of the silicide layer is formed on the sidewall of the recess, the contact area is greatly extended. Therefore, the resistance between the contact of the source/drain and the subsequently formed metal plug or bit line the greatly decreases. Additionally, the layout can be saved. Moreover, the procedure of the invention is simpler than that of the conventional process. Furthermore, since the sidewall of the recess is exposed while the source/drain region is formed, the junction between the source/drain region and the substrate is relatively deep. Hence, the source/drain region is deep enough to prevent leakage between the source/drain region and the substrate.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
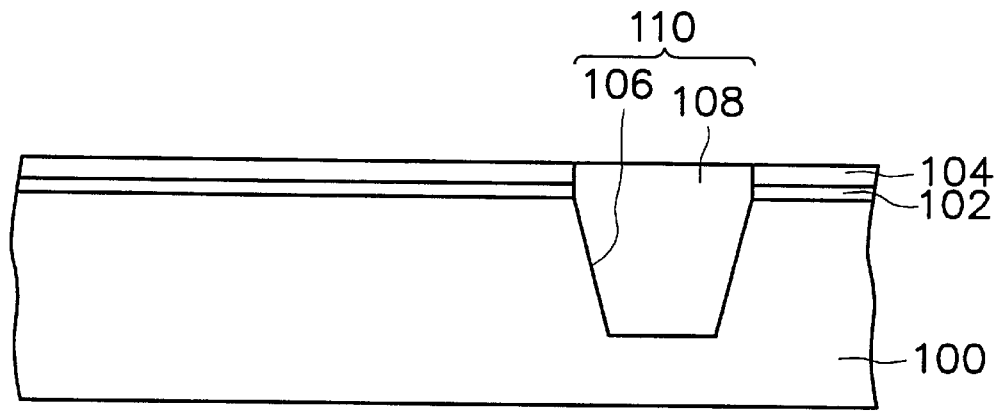
FIGS. 1A through 1C are schematic, cross-sectional views of a process for manufacturing a borderless contact hole.
Figure 1B:
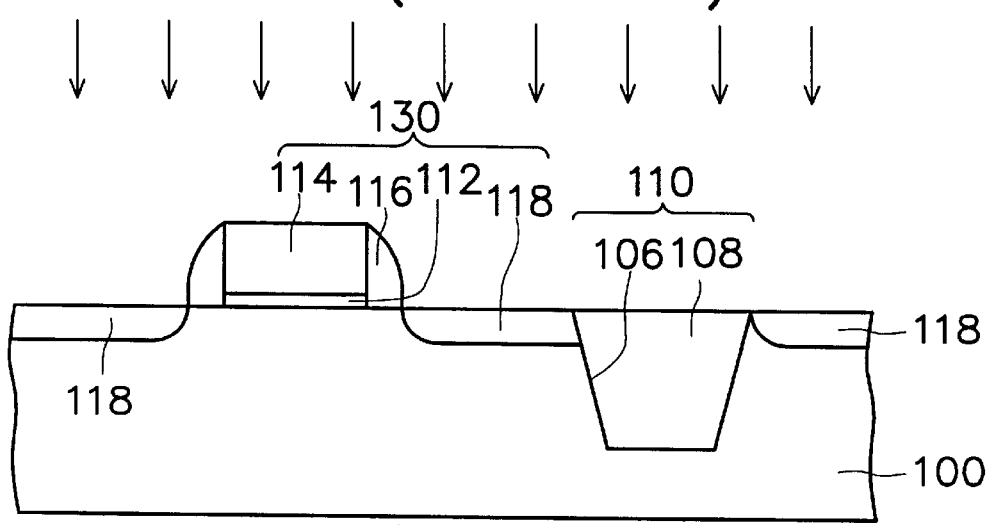
Figure 1C:
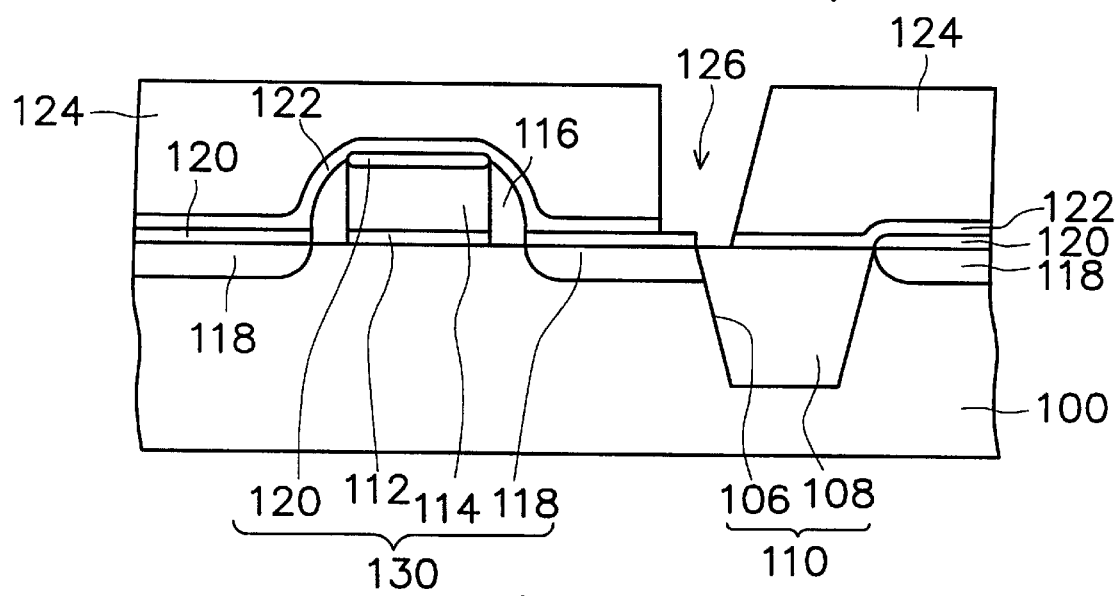

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2F are schematic, cross-sectional views of the process for manufacturing a borderless contact hole in a preferred embodiment according to the invention.

Figure 2A:
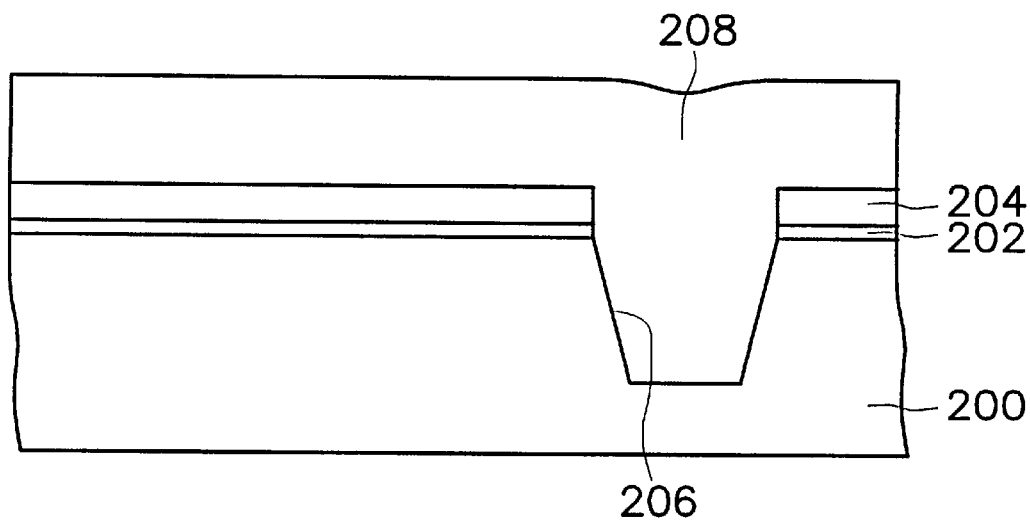
FIGS. 2A through 2F are schematic, cross-sectional views of the process for manufacturing a borderless contact hole in a preferred embodiment according to the invention.

As shown in FIG. 2A, a pad oxide layer 202 is formed on a substrate 200. A silicon nitride layer 204 is formed on the pad oxide layer 202. A trench 206 is formed to penetrate through the silicon nitride layer 204 and the pad oxide layer 202, and into the substrate 200. The thickness of the silicon nitride layer 204 is about 1500–2000 angstroms. An oxide layer 208 is formed on the silicon nitride layer 204 and fills the trench 206. The oxide layer 208 can be formed by atmospheric pressure chemical vapor deposition (APCVD), for example.

Figure 2B:
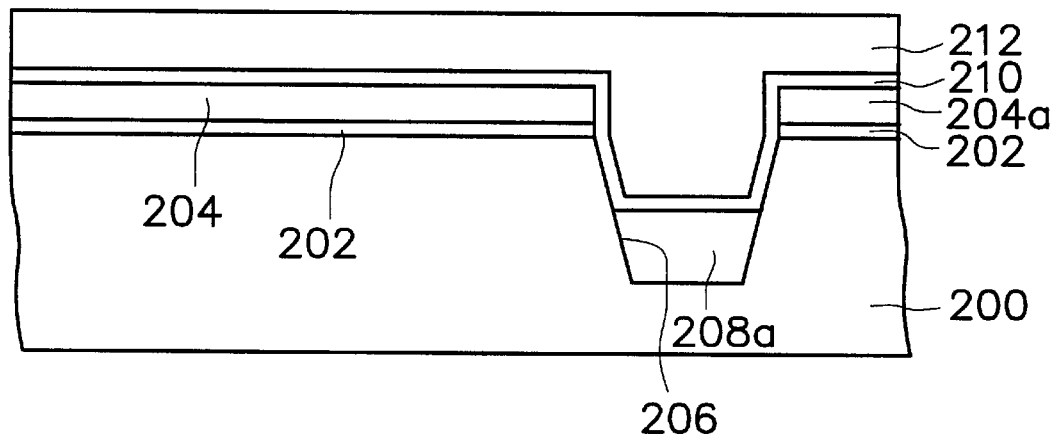

As shown in FIG. 2B, a planarizing step is performed to remove a portion of the oxide layer 208 on the silicon nitride layer 204 and a portion of silicon nitride layer 204 until the thickness of the remaining silicon nitride layer is about 1000–1500 angstroms. The planarizing step can be chemical-mechanical polishing (CMP), for example. An etching back step is performed to remove a portion of the oxide layer 208 in the trench 206 until the surface level of the remaining oxide layer 208 in the trench 206 is lower than that of the substrate 200. The remaining silicon nitride layer 204 and the remaining oxide layer 208 are respectively denoted as silicon nitride layer 204a and oxide layer 208a. An etching stop layer 210 is conformally formed on the silicon nitride layer 204a, the sidewall of the trench 206 and the oxide layer 208a. The thickness of the etching stop layer 210 is about 250–350 angstroms. The etching stop layer 210 can be a silicon nitride layer, for example. An oxide layer 212 is formed on the etching stop layer 210 and fills the trench 206. The oxide layer can be formed by APCVD, for example.

Figure 2C:
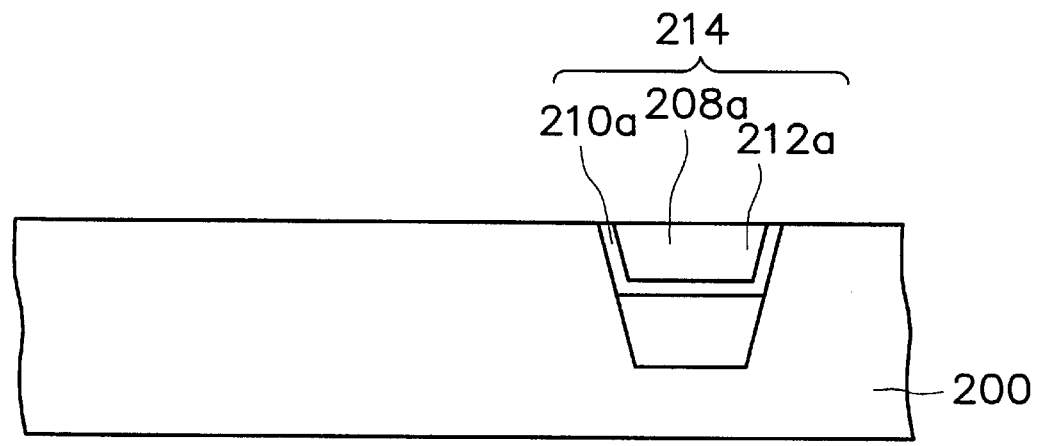

As shown in FIG. 2C, a planarizing step is performed to remove a portion of the oxide layer 212, the etching stop layer 210, the silicon nitride layer 204a and the pad oxide layer 202 until the surface of the substrate 200 is exposed. In this example, the method of removing the silicon nitride layer 204 comprises the steps of removing a portion of the silicon nitride layer 204 by CMP until the thickness of the remaining silicon nitride layer 204 is about 600 angstroms. The remaining silicon nitride layer is then removed by wet etching with phosphoric acid. The remaining etching stop layer 210 in the trench 206 and the remaining oxide layer 212 in the trench are respectively denoted as etching stop layer 210a and oxide layer 212a. The etching stop layer 210a, the oxide layer 212a and the oxide layer 208a together form an STI 214.

Figure 2D:
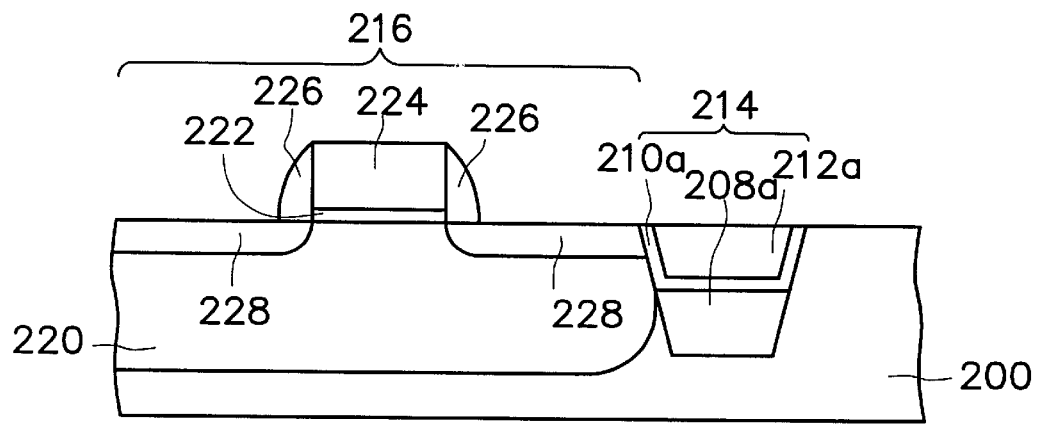

As shown in FIG. 2D, a well 220 is formed in the substrate 200 adjacent to one side of the STI 214. A threshold voltage-implanting region (not shown) is formed in the well 220. A gate electrode 224 having a gate oxide layer 222 formed thereunder is formed on a portion of the well 220. An LDD region 228 is formed in the well 220 exposed by the gate electrode 224 and the STI 214. A spacer 226 is formed on the sidewalls of the gate electrode 224 and the gate oxide layer 222.

Figure 2E:
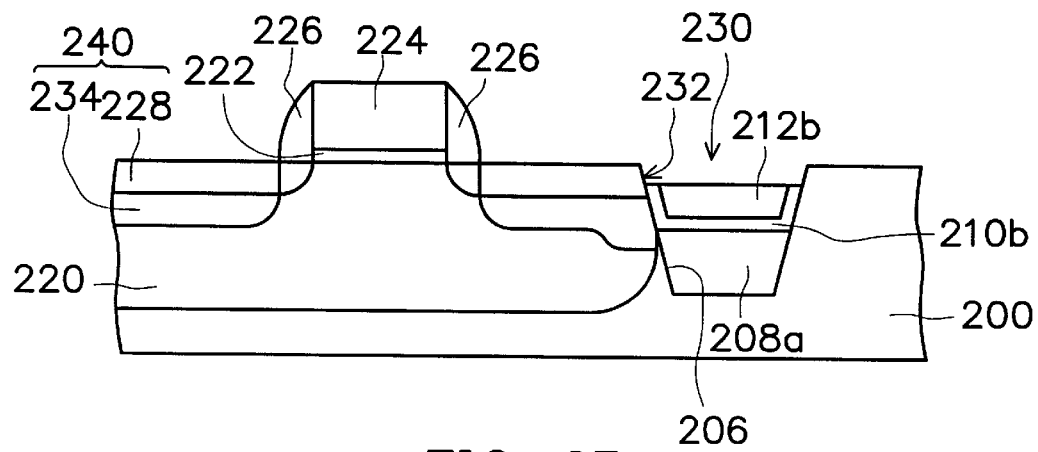

As shown in FIG. 2E, a portion of the oxide layer 212a and the etching stop layer 210a is removed to form a recess 230 in the trench 206 until the thickness of the remaining oxide layer 212a in the trench 206 is about 1000–2000 angstroms. A portion of the sidewall of the trench 206 exposed by the recess 230 is denoted as sidewall 232. The remaining oxide layer 212a and the remaining etching stop layer 210a are respectively denoted as oxide layer 212b and etching stop layer 210b. The surface level constructed by the oxide layer 212b and the etching stop layer 210b is lower than the surface level of the substrate 200. In this example, the method of removing the portion of the oxide layer 212a and the etching stop layer 210a comprises the steps of removing the portion of the oxide layer 212a by etching back and removing the portion of the etching stop layer 210a by wet etching with phosphoric acid until the surface level of the etching stop layer 210b is equal to that of the oxide layer 212b. An ion implanting step is performed to form a heavily doped region 234 in the well 220 exposed by the gate electrode 224, the spacer 226, the etching stop layer 210b and the oxide layer 212b. The heavily doped region 234 and the LDD region together form a source/drain region 240. Since the sidewall 232 is exposed while the heavily doped region 234 is formed, the junction between the heavily doped region 234 and the well 220 is relatively deep. Hence, the source/drain region 240 is deep enough to prevent leakage between the source/drain region 240 and the well 220.

Figure 2F:
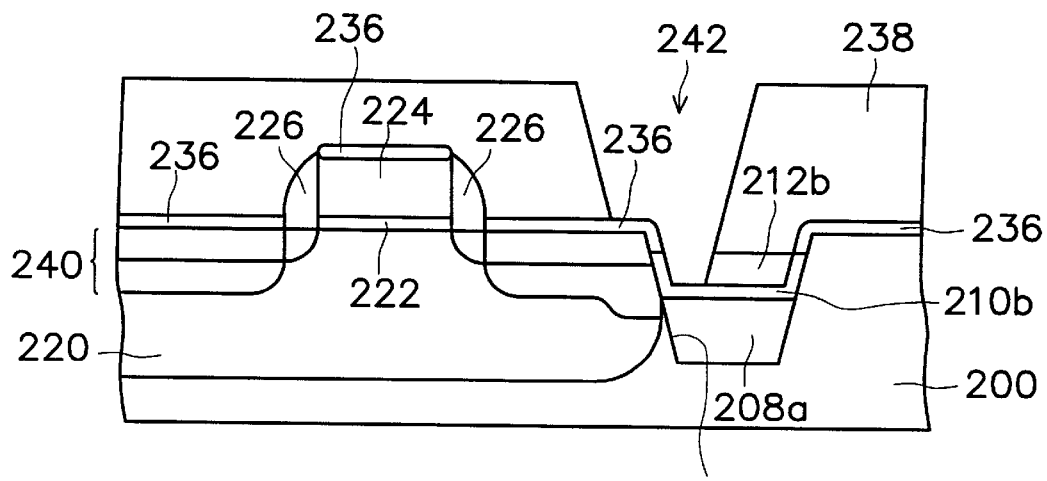

As shown in FIG. 2F, a salicide process is performed to form a silicide layer 236 on the gate electrode 224, the surface of the source/drain region 240, the sidewall 232 and the surface of the substrate 200 that are not covered by any oxide layer or any silicon nitride layer. In this example, the method of forming the silicide layer 236 comprises the steps of forming a conductive layer (not shown) over the substrate 200. Preferably, the conductive layer can be made of refractory metal. The refractory metal includes titanium, tungsten, cobalt, nickel, platinum and palladium, for example. A rapid thermal process is used to perform the silylation between the metal atoms and the silicon atoms to form the silicide layer 236. The silicide layer 236 can be a titanium silicon layer or a cobalt silicon layer, for example. The portions of the conductive layer not engaging the silylation are stripped away to expose the silicide layer 236. A dielectric layer 238 is formed over the substrate 200. The material of the dielectric layer can be silicon oxide, for example. When misalignment happens during contact hole 242 formation, contact hole 242 penetrates through the dielectric layer 238 and the oxide layer 212b until exposing a portion of the silicide layer 236 above the source/drain region 240 and a portion of the etching stop layer 210b.

In the invention, since a portion of the silicide layer is formed on the sidewall 232, the contact area exposed by the contact hole is greatly increased even though the misalignment happens. Therefore, the resistance between the source/drain region 240 and the subsequently formed metal plug or bit line greatly decreases. Additionally, the contact can extend on the STI, so that the layout can be saved. Moreover, because the contact hole 242 can be formed without removing the etching stop layer 210b, the procedure of the invention is simpler than that of the conventional process. Furthermore, since the sidewall 232 is exposed while the heavily doped region 234 is formed, the junction between the heavily doped region 234 and the well 220 is relatively deep. Hence, the source/drain region 240 is deep enough to prevent leakage between the source/drain region 240 and the well 220.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a borderless contact hole formed on a substrate having a pad oxide layer and a silicon nitride layer formed thereon, the method comprising the steps of:

forming a trench penetrating through the silicon nitride layer and the pad oxide layer and into the substrate;

forming a first oxide layer in the trench, wherein a surface level of the first oxide layer is lower than that of the substrate;

forming an etching stop layer on the silicon nitride layer, a sidewall of the trench and the first oxide layer, conformally;

forming a second oxide layer on the etching stop layer and filling the trench;

removing a portion of the second oxide layer, a portion of the etching stop layer, the silicon nitride layer and the pad oxide layer;

removing a portion of the second oxide layer in the trench and a portion of the etching stop layer in the trench to form a recess until the surface level constructed by the remaining second oxide layer and the remaining etching stop layer is lower than a surface level of the substrate;

forming a source/drain region in the substrate adjacent to the trench;

forming a silicide layer on a surface of the source/drain region and a sidewall of the recess;

forming a dielectric layer over the substrate; and forming a contact hole penetrating through the dielectric layer and exposing a portion of the silicide layer.

2. The method of claim 1, wherein material of the etching stop layer includes silicon nitride.

3. The method of claim 2, the etching stop layer is about 250–350 angstroms thick.

4. The method of claim 1, wherein the step of forming the first oxide layer further comprises the steps of:

forming an oxide layer over the substrate and filling the trench;

removing a portion of the oxide layer and a portion of the silicon nitride layer until the thickness of the silicon nitride layer is about 1000–1500 angstroms; and removing a portion of the oxide layer until the surface level of the first oxide layer is lower than that of the substrate.

5. The method of claim 4, wherein the step of removing the portion of the oxide layer and the portion of the silicon nitride layer includes chemical-mechanical polishing.

6. The method of claim 4, wherein the step of removing the portion of the oxide layer until the surface level of the first oxide layer is lower than that of the substrate includes etching back.

7. The method of claim 4, wherein the step of forming the oxide layer includes atmospheric pressure chemical vapor deposition.

8. The method of claim 1, wherein the step of removing the portion of the second oxide layer in the trench and the portion of the etching stop layer in the trench comprises the steps of:

performing an etching back step to remove the portion of the second oxide layer in the trench; and performing a wet etching step with phosphoric acid to remove the portion of the etching stop layer until the surface level of the etching stop layer is equal to that of the second oxide layer.

9. The method of claim 1, wherein the step of forming the silicide layer includes salicide process.

10. The method of claim 1, wherein after the step of removing the portion of the second oxide layer, the portion of the etching stop layer, the silicon nitride layer and the pad oxide layer, further comprises the steps of:

forming a well in the substrate adjacent to the trench;

forming a gate electrode over the well; and forming a spacer on a sidewall of the gate electrode.

11. The method of claim 10, wherein after the step of forming the gate electrode, further comprises the step of forming an LDD region in the well exposed by the gate electrode and the trench.

12. A method of manufacturing a borderless contact hole formed on a substrate having a trench formed therein, an etching stop layer conformally formed over the trench and an oxide layer filling the trench, the method comprising the steps of:

removing a portion of the oxide layer and a portion of the etching stop layer to expose a portion of a sidewall of the trench, wherein a surface level constructed by the remaining oxide layer and the remaining etching stop layer is lower than a surface level of the substrate;

performing an ion implanting step to form a source/drain region in the substrate adjacent to the trench;

forming a silicide layer on a surface of the source/drain region and on the exposed sidewall of the trench;

forming a dielectric layer over the substrate; and forming a contact hole penetrating through the dielectric layer and exposing a portion of the silicide layer.

13. The method of claim 12, wherein between a bottom surface of the trench and the etching stop layer, further comprises an oxide layer.

14. The method of claim 12, wherein before the step of removing the portion of the oxide layer and the portion of the etching stop layer, further comprises the steps of:

forming a well in the substrate adjacent to the trench;

forming a gate electrode over the well; and forming a spacer on a sidewall of the gate electrode.

15. The method of claim 14, wherein after the step of forming the gate electrode, further comprises the step of forming an LDD region in the well exposed by the gate electrode and the trench.

16. The method of claim 12, wherein the step of forming the silicide layer includes a salicide process.

* * * * *